United States Patent
Chiang et al.

(10) Patent No.: US 10,777,536 B2
(45) Date of Patent: Sep. 15, 2020

(54) SEMICONDUCTOR PACKAGE WITH AIR CAVITY

(71) Applicant: Infineon Technologies AG, Neubiberg (DE)

(72) Inventors: Chau Fatt Chiang, Melaka (MY); April Coleen Tuazon Bernardez, Melaka (MY); Junny Abdul Wahid, Melaka (MY); Roslie Saini bin Bakar, Melaka (MY); Kon Hoe Chin, Pusing (MY); Hock Heng Chong, Melaka (MY); Kok Yau Chua, Melaka (MY); Hsieh Ting Kuek, Melaka (MY); Chee Hong Lee, Melaka (MY); Soon Lee Liew, Ipoh (MY); Nurfarena Othman, Melaka (MY); Pei Luan Pok, Melaka (MY); Werner Reiss, Raubling (DE); Stefan Schmalzl, Sauerlach (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/213,478

(22) Filed: Dec. 7, 2018

(65) Prior Publication Data

US 2019/0181120 A1 Jun. 13, 2019

Related U.S. Application Data

(60) Provisional application No. 62/596,177, filed on Dec. 8, 2017.

(51) Int. Cl.
*H01L 25/075* (2006.01)
*H01L 25/065* (2006.01)
(Continued)

(52) U.S. Cl.
CPC .......... *H01L 25/0657* (2013.01); *B81B 7/007* (2013.01); *B81C 1/00095* (2013.01);
(Continued)

(58) Field of Classification Search
CPC ............. H01L 25/0657; H01L 25/0756; H01L 23/315; H01L 23/31; H01L 23/49838;
(Continued)

(56) References Cited

U.S. PATENT DOCUMENTS

| 5,437,915 A | 8/1995 | Nishimura et al. |
| 5,729,433 A | 3/1998 | Mok |

(Continued)

FOREIGN PATENT DOCUMENTS

| KR | 20120056624 A | 6/2012 |
| WO | 2010080068 A1 | 7/2010 |

OTHER PUBLICATIONS

"EpoxyClay Steel", Pioneer Adhesives, Inc., Accessed online at http://www.pioneer-adhesives.com/product/epoxyclay-steel on Dec. 11, 2018.
(Continued)

*Primary Examiner* — Hsien Ming Lee
(74) *Attorney, Agent, or Firm* — Murphy, Bilak & Homiller, PLLC

(57) ABSTRACT

Embodiments of chip-package and corresponding methods of manufacture are provided. In an embodiment of a chip-package, the chip-package includes: a carrier having a first side and a second side opposing the first side; a first chip coupled to the first side of the carrier; a second chip coupled to the second side of the carrier; an encapsulation with a first portion, which at least partially encloses the first chip on the first side of the carrier, and a second portion, which at least partially encloses the second chip on the second side of the carrier; a via extending through the first portion of the (Continued)

encapsulation, the carrier and the second portion of the encapsulation; and an electrically conductive material at least partly covering a sidewall of the via in the first portion or the second portion of the encapsulation, to electrically contact the carrier at either side.

22 Claims, 14 Drawing Sheets

(51) Int. Cl.
*H01L 23/498* (2006.01)
*B81B 7/00* (2006.01)
*H01L 23/31* (2006.01)
*B81C 1/00* (2006.01)
*H01L 23/10* (2006.01)

(52) U.S. Cl.
CPC .............. *H01L 23/10* (2013.01); *H01L 23/31* (2013.01); *H01L 23/3157* (2013.01); *H01L 23/498* (2013.01); *H01L 23/49838* (2013.01); *H01L 25/065* (2013.01); *B81B 2201/0271* (2013.01); *B81B 2201/0292* (2013.01); *B81B 2207/012* (2013.01); *B81B 2207/07* (2013.01); *B81C 2203/0154* (2013.01); *B81C 2203/032* (2013.01); *B81C 2203/0792* (2013.01); *H01L 2225/06548* (2013.01); *H01L 2225/06572* (2013.01)

(58) Field of Classification Search
CPC . H01L 23/10; H01L 23/3185; H01L 23/5384; H01L 23/3114; H01L 2225/06572; H01L 2225/06548; B81B 7/007; B81C 2203/0792

See application file for complete search history.

(56) References Cited

U.S. PATENT DOCUMENTS

| | | | |
|---|---|---|---|
| 6,479,322 B2 | 11/2002 | Kawata et al. | |
| 6,534,876 B1 | 3/2003 | Glenn | |
| 7,633,765 B1 | 12/2009 | Scanlan et al. | |
| 7,944,034 B2 | 5/2011 | Gerber et al. | |
| 8,026,589 B1 | 9/2011 | Kim et al. | |
| 8,759,956 B2 | 6/2014 | Soller | |
| 9,224,688 B2 | 12/2015 | Chuang et al. | |
| 9,230,883 B1 | 1/2016 | Hiner et al. | |
| 9,559,064 B2 | 1/2017 | Chen et al. | |
| 9,564,409 B2 | 2/2017 | Seddon et al. | |
| 10,217,728 B2* | 2/2019 | Appelt ................ H01L 25/0652 |
| 10,264,664 B1 | 4/2019 | Vinciarelli et al. | |
| 2004/0061213 A1 | 4/2004 | Karnezos | |
| 2005/0167814 A1 | 8/2005 | Beroz et al. | |
| 2007/0080437 A1 | 4/2007 | Marimuthu et al. | |
| 2007/0257340 A1 | 11/2007 | Briggs et al. | |
| 2009/0230487 A1* | 9/2009 | Saitoh .................. B81B 7/0061 257/419 |
| 2009/0321956 A1 | 12/2009 | Sasaki et al. | |
| 2010/0044808 A1 | 2/2010 | Dekker et al. | |
| 2010/0207257 A1* | 8/2010 | Lee ....................... B81B 7/0061 257/660 |
| 2011/0221005 A1 | 9/2011 | Luo et al. | |
| 2012/0108013 A1 | 5/2012 | Fujisawa et al. | |
| 2013/0050227 A1* | 2/2013 | Petersen ............... H01L 23/053 345/501 |
| 2013/0280826 A1 | 10/2013 | Scanlan et al. | |
| 2014/0332942 A1 | 11/2014 | Kanemoto | |
| 2015/0187608 A1 | 7/2015 | Ganesan et al. | |
| 2015/0279778 A1 | 10/2015 | Camacho et al. | |
| 2015/0380384 A1 | 12/2015 | Williams et al. | |
| 2016/0005675 A1 | 1/2016 | Tong | |
| 2016/0155728 A1 | 6/2016 | Zhao et al. | |
| 2017/0092567 A1 | 3/2017 | Vincent et al. | |
| 2017/0125355 A1 | 5/2017 | Su et al. | |
| 2017/0256472 A1 | 9/2017 | Chan et al. | |
| 2017/0317015 A1 | 11/2017 | Lee et al. | |
| 2018/0124922 A1 | 5/2018 | Ji et al. | |
| 2018/0211946 A1 | 7/2018 | Shiu | |
| 2018/0358292 A1 | 12/2018 | Kong et al. | |
| 2019/0115287 A1 | 4/2019 | Derai et al. | |
| 2019/0157173 A1 | 5/2019 | Danny Koh et al. | |
| 2019/0259629 A1 | 8/2019 | Ziglioli | |

OTHER PUBLICATIONS

"Polymer Clay FAQ", Polymer Clay Web, 2011, Accessed online at http://www.polymerclayweb.com/faq.aspx on Dec. 7, 2018.
"This is Mouldable Glue", Sugru, Accessed online at https://sugru.com/about on Dec. 7, 2018.
"Dual Exposed Pad PKG", Amkor Technology, 2010, pp. 1-4.
"Laser-Direct-Structuring (LDS) of 3D-MIDs", LPKF Laser & Electronics AG, https://www.youtube.com/watch?v=VLL9NEA-9PI, Jun. 14, 2010.
"MicroLeadFrame® (MLF | QFN | VQFN | LFCSP | DFN | LPCC)", Amkor Technology, https://www.amkor.com/go/qfn, accessed Aug. 10, 2017, pp. 1-3.
"SO8-FL (Flat Lead) Power Discrete", Amkor Technology, https://www.amkor.com/go/packaging/allpackages/so8/so8flflatleadpowerdiscrete, accessed Aug. 10, 2017, pp. 1-2.
"TSON8-FL (Flat Lead) Power Discrete", Amkor Technology, https://www.amkor.com/go/packaging/all-packages/tson8/tson8-fl-flat-lead-power-discrete, accessed Nov. 16, 2017, pp. 1-2.

* cited by examiner

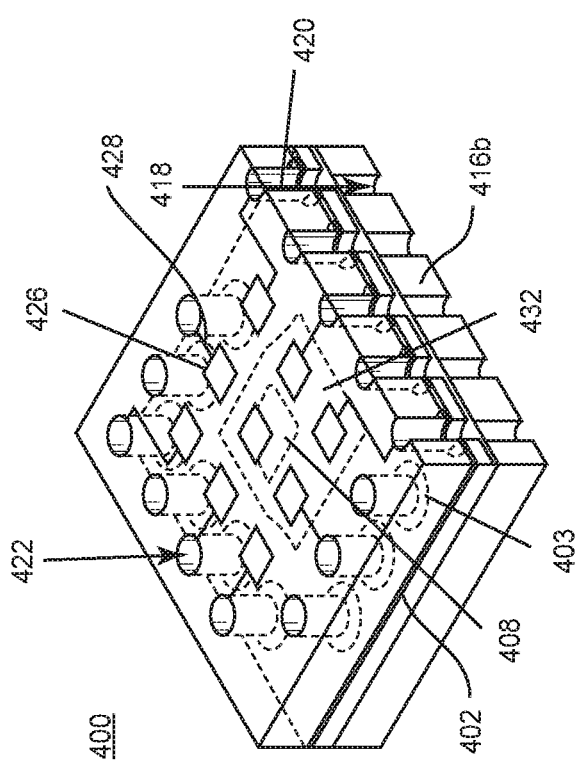
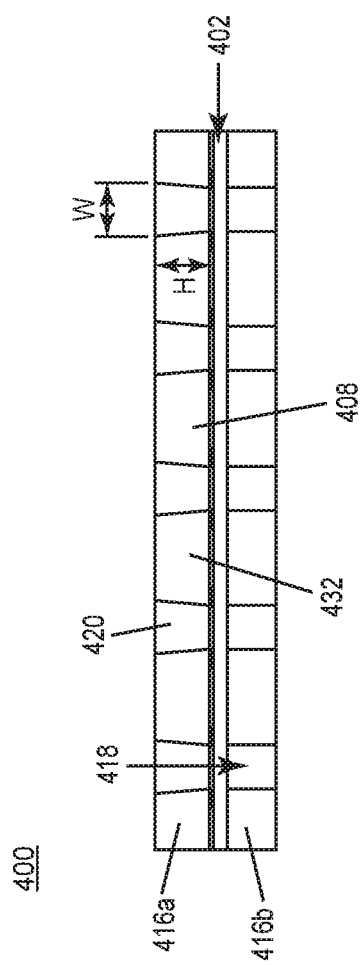
Figure 5F
Figure 5G

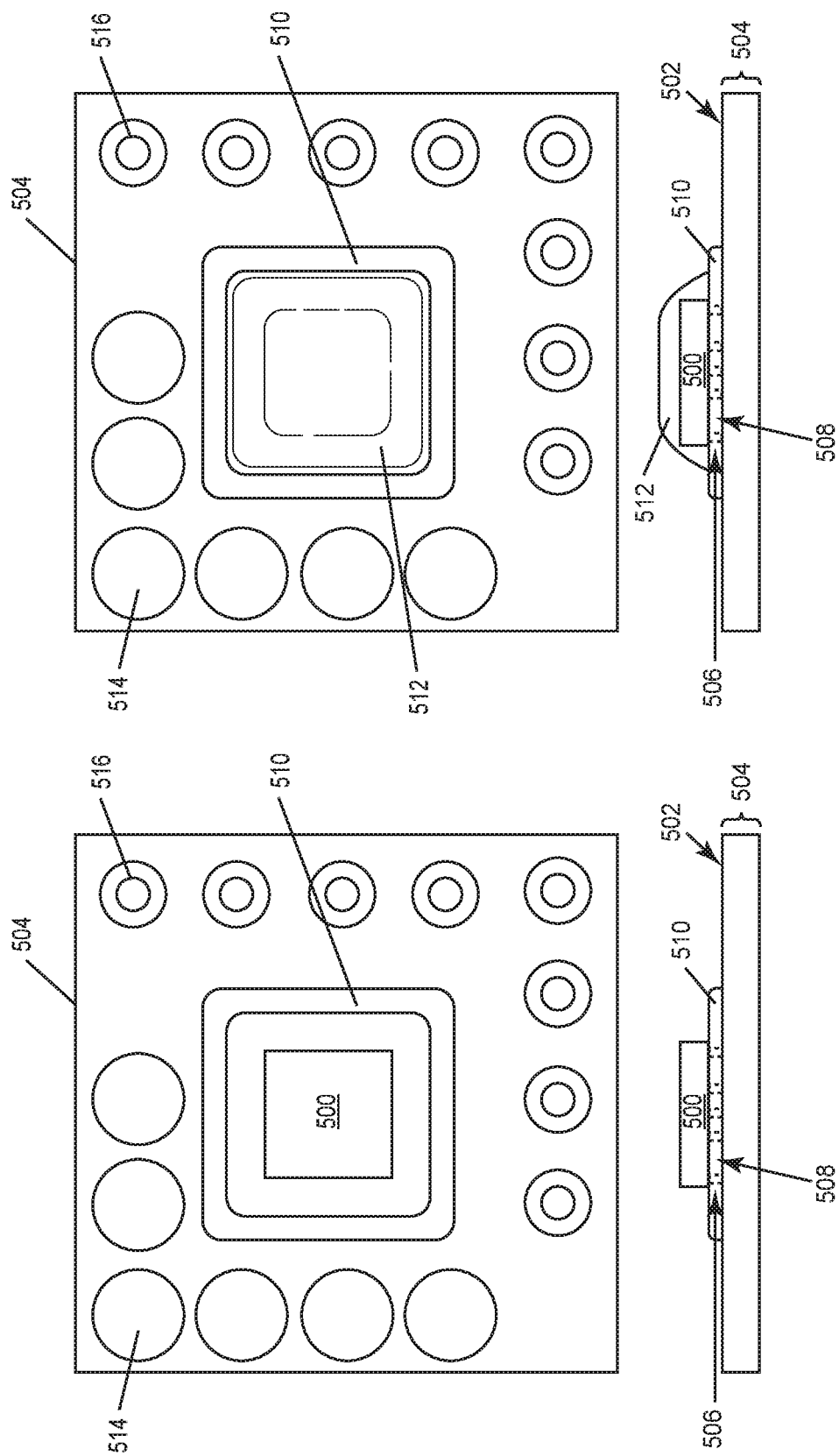

SEMICONDUCTOR PACKAGE WITH AIR CAVITY

BACKGROUND

Two or more semiconductor chips (dies) are often integrated in the same package, e.g., in the case of a power transistor die and a driver die, a sensor die and a controller die, etc. Some conventional multi-chip packaging solutions use multiple PCBs (printed circuit boards) to stack chips, which increases overall packaging cost. Chip stacking also has increased manufacturing complexity. For example, a high precision wire bond technique may be needed which is costly. Also, the likelihood of chip damage increases due to the complex manufacturing process. Other conventional solutions use chip embedding. Chip embedding also is complex, and involves a serial manufacturing process. Chip embedding offers no flexibility in chip variation once a chip is fixed in place. Chip embedding may suffer from artificially high yield loss since a good chip will be lost if a faulty package cannot be reworked.

Some package solutions require a cavity, e.g., in the case of a MEMS (microelectromechanical systems) sensor solution. The membrane of a MEMS sensor should not be contacted by the encapsulation material for the package. A metal lid may be used to cover and protect the MEMS sensor, but increases package height. A Si lid may instead be attached by silicone to cover and protect the MEMS sensor, but increases package cost. Silicone glue may instead be used to cover and protect the MEMS sensor, but may bleed which is hard to control.

Thus, there is a need for improved chip-packages.

SUMMARY

According to an embodiment of a chip-package, the chip-package comprises: a carrier having a first side and a second side opposing the first side; a first chip coupled to the first side of the carrier; a second chip coupled to the second side of the carrier; an encapsulation with a first portion, which at least partially encloses the first chip on the first side of the carrier, and a second portion, which at least partially encloses the second chip on the second side of the carrier; a via extending through the first portion of the encapsulation, the carrier and the second portion of the encapsulation; and an electrically conductive material at least partly covering a sidewall of the via in the first portion or the second portion of the encapsulation, to electrically contact the carrier at either the first side or the second side.

An upper half or a lower half of the via may be plated by the electrically conductive material, and the other half of the via may be devoid of the electrically conductive material.

Separately or in combination, an upper half and a lower half of the via may each be plated by the electrically conductive material, one of the plated halves of the via electrically may contact the carrier at one of the sides of the carrier, and the other plated half of the via may provide a thermal conduction path to the other side of the carrier.

Separately or in combination, the first chip and the second chip may be vertically aligned.

Separately or in combination, the chip-package may further comprise a metallization layer located on the first portion or the second portion of the encapsulation, wherein the metallization layer comprises a metal pad and a metal trace which connects the metal pad to the electrically conductive material at a first end of the via, and wherein the electrically conductive material electrically contacts the carrier at a second end of the via opposite the first end.

Separately or in combination, a ratio of a depth of the via to a width of the via may be greater than 1:1.

Separately or in combination, the electrically conductive material may fill the via in the first portion or the second portion of the encapsulation.

Separately or in combination, the chip-package may further comprise a solder bump electrically contacting the electrically conductive material at a first end of the via, wherein the electrically conductive material electrically contacts the carrier at a second end of the via opposite the first end.

Separately or in combination, the chip-package may further comprise a cavity between the first chip and the carrier, or between the second chip and the carrier.

Separately or in combination, the chip-package may further comprise a material sealing the cavity around a perimeter of a recess formed in the encapsulation and in which the first chip or the second chip is disposed.

Separately or in combination, the material may be a polymer clay, an insulative rigid foam or a gel.

Separately or in combination, the first chip or the second chip may be a MEMS chip, and the cavity may abut the MEMS chip.

Separately or in combination, the chip-package may further comprise a glue-based sealing structure sealing the cavity.

Separately or in combination, the glue-based sealing structure may comprise a first glue laterally surrounding the first chip or the second chip and a second glue covering the chip laterally surrounded by the first glue.

Separately or in combination, the glue-based sealing structure may comprise a first glue laterally surrounding the first chip or the second chip and a second glue filling a gap between the first glue and the chip laterally surrounded by the first glue.

Separately or in combination, the chip-package may further comprise a material at least partly filling the one or more vent holes to close off the passage.

Separately or in combination, the material at least partly filling the one or more vent holes may comprise solder, a Cu pillar, a SnAg bump, glue and/or epoxy.

According to an embodiment of a chip-package, the chip-package comprises: a carrier having a first side and a second side opposing the first side; a first chip coupled to the first side of the carrier; an encapsulation which at least partially encloses the first chip on the first side of the carrier; a cavity between the first chip and the carrier; a glue laterally surrounding the first chip and partly defining the cavity; and one or more vent holes formed in the carrier and providing a passage to the cavity. The chip-package may further comprise a material at least partly filling the one or more vent holes to close off the passage. Separately or in combination, the material at least partly filling the one or more vent holes may comprise solder, a Cu pillar, a SnAg bump, glue and/or epoxy.

According to an embodiment of a chip-package, the chip-package comprises: a carrier with a first side; a first chip coupled to the first side of the carrier by a coupling structure, wherein the coupling structure provides a distance between the first chip and the carrier; and an encapsulation on the first side of the carrier, wherein the encapsulation is at least partially laterally spaced apart from the first chip as to form a gap between the first chip and the encapsulation, wherein the gap extends to the first side of the carrier. The gap may comprise an air gap. Separately or in combination, the chip-package may further comprise a material in the gap between the first chip and the encapsulation, wherein a cavity is formed by the material in the gap, the carrier and the chip.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIGS. 5A through 5G illustrate different views of another embodiment of a chip-package having an arrangement of stacked chips.

FIGS. 6A and 6B illustrate an embodiment of sealing a cavity of a chip-package.

DETAILED DESCRIPTION

The embodiments described herein provide chip-packages and corresponding methods of manufacture. In some embodiments, the chip-package has one or more vias which extend through entire thickness of the package. One half of the via(s) may be used for electrical connections to a chip included in the package. The other half of the via(s) may provide a thermal conduction path at the opposite side of the package. This half of the via(s) may or may not also provide electrical connections, e.g., to the same or different chip included in the package. In some embodiments, the chip-package may have a cavity, e.g., in the case of a MEMS sensor or SAW (surface acoustic wave) filter application.

The cavity may be partly defined by a cured solid material, cured glue, etc. In the case of glue being used to partly define the cavity, one or more vent holes may be formed in the carrier for the MEMS sensor to relieve pressure which builds-up in the cavity during curing of the glue. In some embodiments, the chip carrier included in the chip-package may be a lead frame instead of a PCB (printed circuit board) and the package encapsulation may be at least partially laterally spaced apart from the chip as to form a gap between the chip and the encapsulation. Still other embodiments are described. It is to be understood that the features of the various embodiments described herein may be combined with each other, unless specifically noted otherwise. Various examples are provided at the end of this section, as illustrative combinations of the embodiments described herein.

Figure 1:
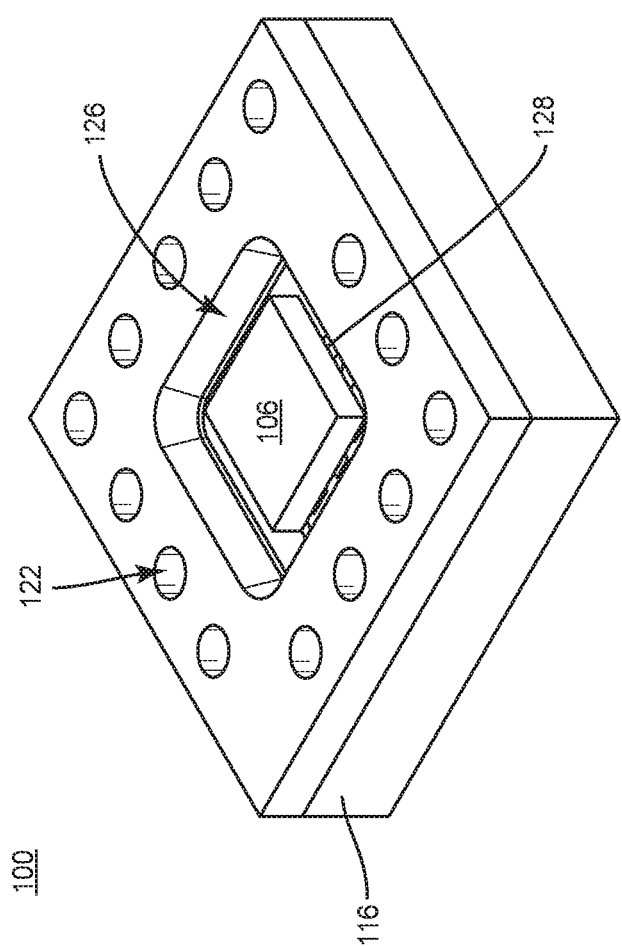
FIG. 1 illustrates a side perspective view of an embodiment of a chip-package having an arrangement of stacked chips.
Figure 2A:
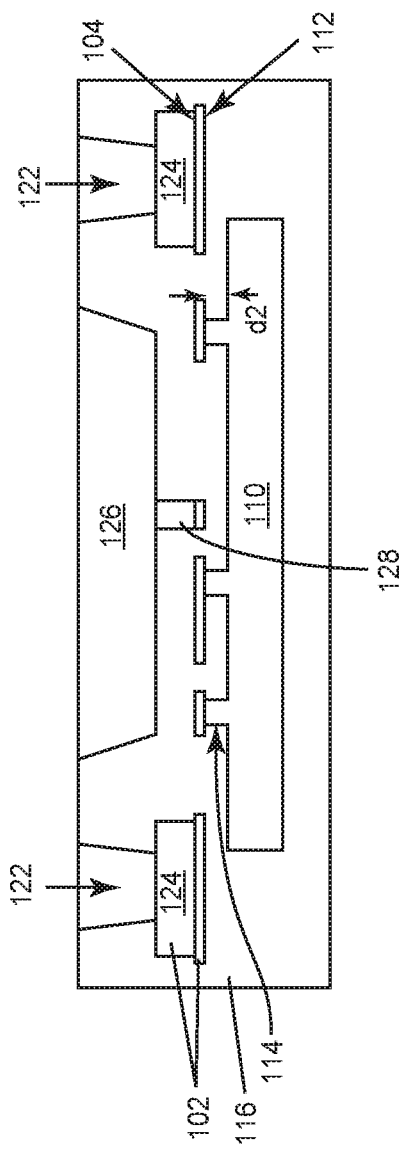
FIGS. 2A and 2B illustrate the chip-package 100 at different stages of manufacturing.
Figure 2B:
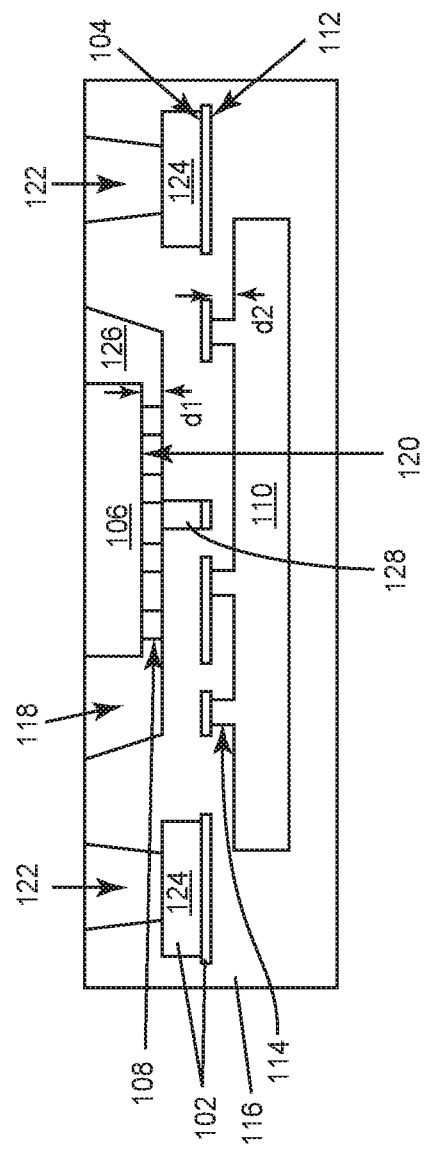

FIG. 1 illustrates a side perspective view of an embodiment of a chip-package 100. FIGS. 2A and 2B illustrate the chip-package 100 at different stages of manufacturing.

The chip-package 100 includes a carrier 102 with a first side 104. In one embodiment, the carrier 102 is a lead frame. A first chip 106 is coupled to the first side 104 of the carrier 102 by a coupling structure 108. The coupling structure 108 may include Cu pillars, filled vias, solder, etc. The coupling structure 108 provides a distance (d1) between the first chip 106 and the carrier 102. The chip-package 100 may include a second chip 110 coupled to the opposing second side 112 of the carrier 102 by a coupling structure 114 which may include Cu pillars, filled vias, solder, etc. and provides a distance (d2) between the second chip 110 and the carrier 102. In one example, the chip-package 100 forms an RF module, the first chip 106 is a MEMS-based tunable filter and the second chip 110 is an RF chip.

An encapsulation 116, such as a mold compound, is provided on the first and second sides 104, 112 of the carrier 102. The encapsulation 116 is at least partially laterally spaced apart from the first chip 106 as to form a lateral gap 118, e.g. an air gap, between the first chip 106 and the encapsulation 116. The lateral gap 118 may extend to the first side 104 of the carrier 102. The lateral gap 118 allows for proper operation of a sensitive area 120 such as a membrane or similar structure in the case of a MEMS-based tunable filter, MEMS sensor, etc., by preventing the encapsulation 116 from impinging upon the sensitive area 120 of the first chip 106.

FIG. 2A shows the chip-package 100 after the second chip 110 is coupled to the second side 112 of the carrier 102 and the encapsulation 116 is formed. The second chip 110 is embedded in the encapsulation 116 and coupled to the second side 112 of the carrier 102 by a coupling structure 114. At the side of the encapsulation opposite the second chip 110, vias 122 formed e.g. by laser drilling to expose contact areas 124 of the carrier 102, e.g., leads in the case of a lead frame-based carrier or metal pads in the case of a PCB-based carrier. The vias 122 may be plated or filled, to form electrical connections to the coupling structure 114. A cavity 126 is formed in the side of the encapsulation 116 opposite the second chip 110. For example, in the case of a mold compound as the encapsulation 116, the cavity 126 may be molded into the encapsulation 116 during a standard molding process such as film-assisted molding, transfer molding, injection molding, etc. to form a pre-molded frame which includes the second chip 110. Electrical connections between the second chip 110 and the carrier 102 are formed prior to molding, e.g., via the second coupling structure 114.

FIG. 2B shows the chip-package after the first chip 106 is positioned in the cavity 126 and coupled to the carrier 102 by the corresponding coupling structure 108. The cavity 126 is larger than the first chip 106 so that the encapsulation 116 is at least partially laterally spaced apart from the first chip 106, thereby forming a lateral gap 118 such as an air gap between the first chip 106 and the encapsulation 116. Bonds pads 128 of the carrier 102 to which the first chip 106 is to be coupled are exposed in the cavity 126 prior to coupling of the first chip 106. In one embodiment, the first chip 106 has a flip-chip configuration and the coupling structure 108 has Cu pillars or solder bumps which couple the first chip 106 to the exposed bond pads 128 of the carrier 102. Laser direct imaging may be used to expose the bond pads 128 and form the vias 122 in the perimeter of the encapsulation 116. A typical die bond process may be used to land the first chip 106 into the pre-molded frame.

Figure 3:
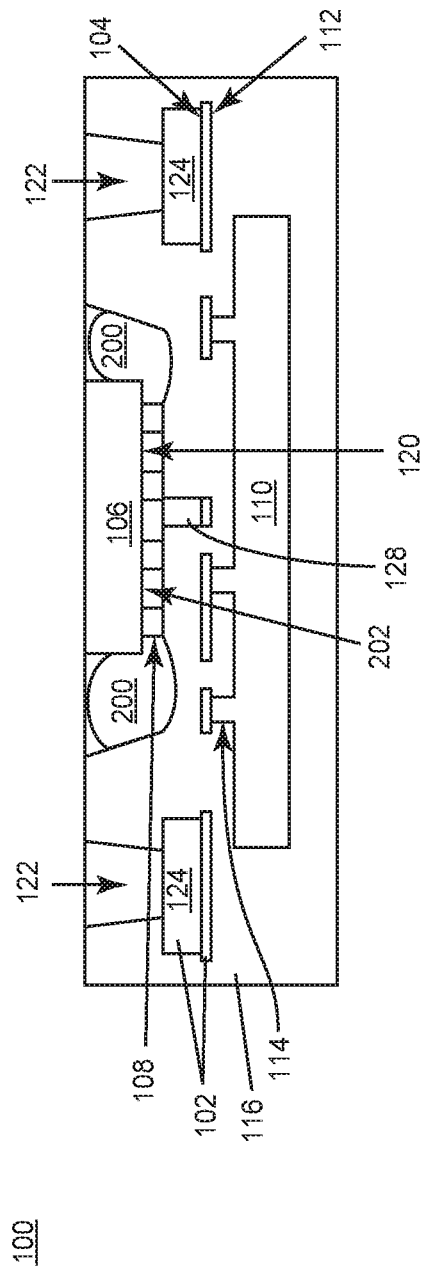
FIG. 3 illustrates a cross-sectional view of the chip-package of FIG. 1 with a material provided in a lateral gap between a chip and an encapsulation.

FIG. 3 shows the chip-package 100 of FIG. 1 after a material 200 is provided in the lateral gap 118 between the first chip 106 and the encapsulation 116. The material 200 fills the perimeter of the lateral gap 118, thereby forming a cavity 202 defined by the material 200 in the gap 118, the carrier 102 and the first chip 106. The cavity 202 may be sealed, depending on the contiguousness and porosity of the material 200 filling the perimeter of the lateral gap 118. In one embodiment, a semisolid material such as polymer clay, high-density insulative rigid foam (PE foam), gel, etc. is dispensed along the perimeter of the lateral gap 118 to fill the empty lateral space between the first chip 106 and the encapsulation 116 but not cover the sensitive area 120 of the first chip 106. The semisolid material may solidify after curing at elevated temperature. For example, polymer clay is essentially PVC (polyvinyl chloride) which is plastic, but until cured, is a very malleable plastic. Polymer clay can be shaped and reshaped a multitude of times without deterioration. Once cured, polymer clay is hard and durable.

Figure 4:
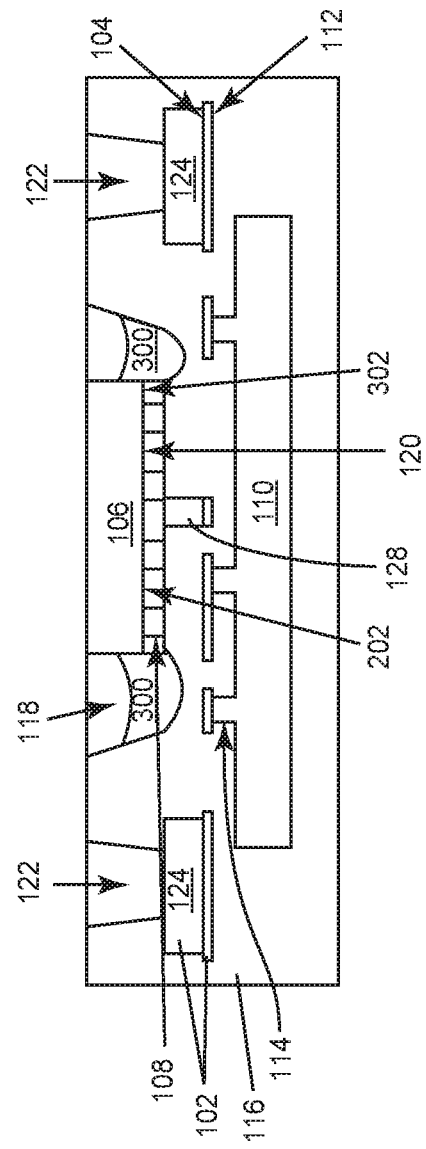
FIG. 4 illustrates a cross-sectional view of the chip-package of FIG. 1 with a material provided in the lateral gap between the chip and the encapsulation, according to another embodiment.

FIG. 4 shows another embodiment of the chip-package 100 of FIG. 1 after a material 300 is provided in the lateral gap 118 between the first chip 106 and the encapsulation 116. As described above in connection with FIG. 3, a semisolid material such as polymer clay, high-density insulative rigid foam (PE foam), gel, etc. may be dispensed along the perimeter of the lateral gap 118 to fill the empty space but not cover the sensitive area 120 of the first chip 106, and then solidified by curing at elevated temperature.

The shape of the material 200/300 post-curing may differ depending on the type of material used, the manner in which the material 200/300 is dispensed and shaped, etc., as shown in FIGS. 3 and 4. For example, the top surface of the material 200 in FIG. 3 has a convex shape, the top surface of the material 300 in FIG. 4 has a concave shape, or the material 200/300 may have yet another shape (e.g., flat, undulating, etc.). The material 200 in FIG. 3 laterally extends to the outermost part of the coupling structure 108 for the first chip 106. The material 300 in FIG. 4 terminates laterally before reaching the outermost part of the coupling structure 108, so that there is a lateral gap 302 between the material 300 and the outermost part of the coupling structure 108.

Figure 5C:
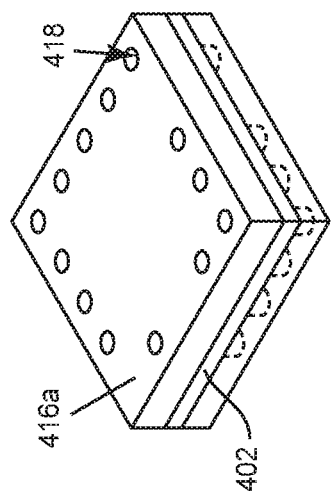
Figure 5B:
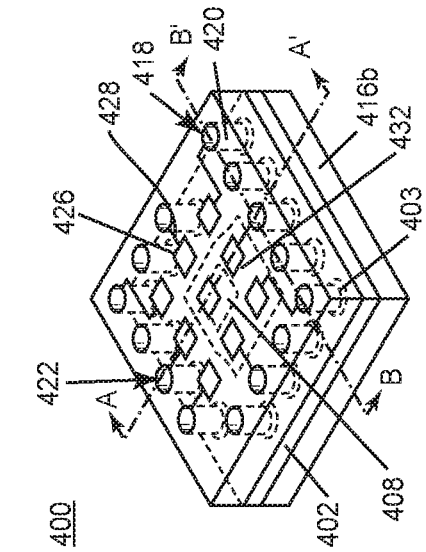
Figure 5A:
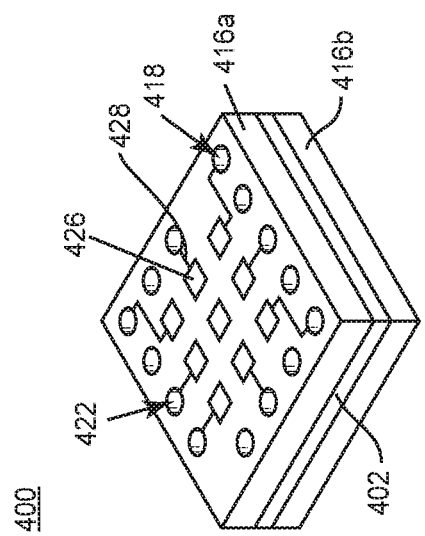
Figure 5D:
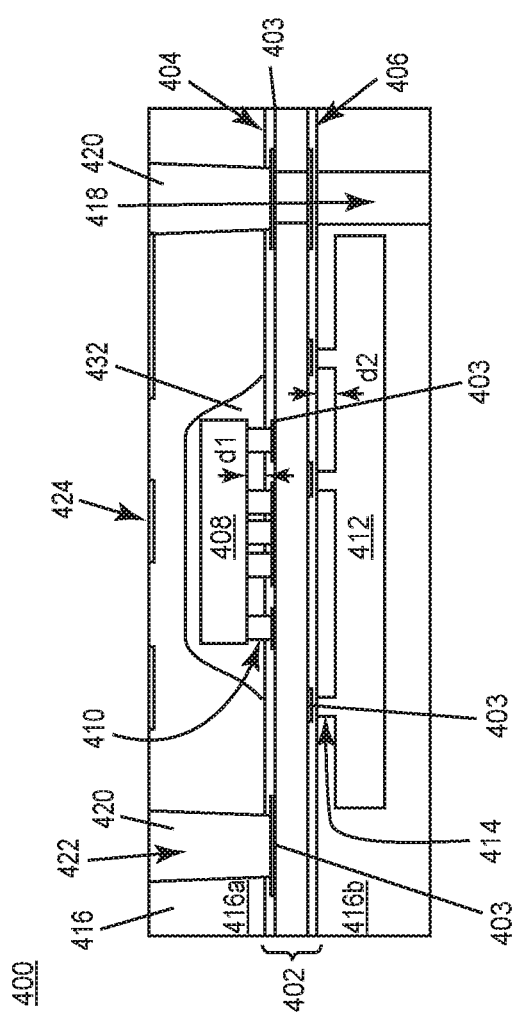
Figure 5E:
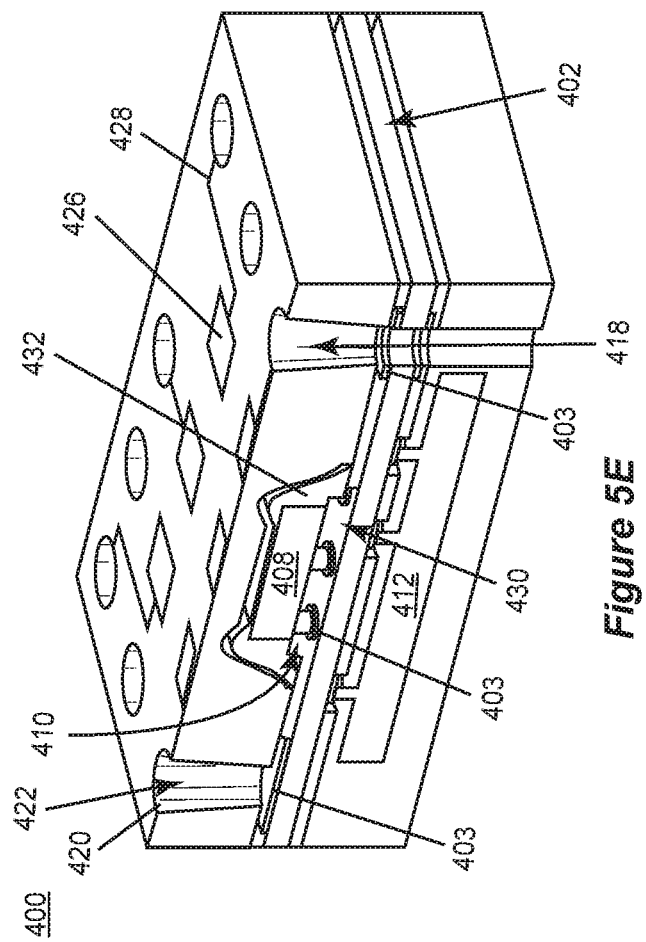

FIGS. 5A through 5G illustrate another embodiment of a chip-package 400 having an arrangement of stacked chips. FIG. 5A shows a top-side perspective view of the chip-package 400, FIG. 5B shows the same view as FIG. 5A but with certain internal details of the package 400 in view, and FIG. 5C shows a bottom-side perspective view of the chip-package 400. FIG. 5D shows a cross-sectional view of the chip-package 400 along the line labelled A-A' in FIG. 5B, and FIG. 5E shows a corresponding side perspective view of the chip-package 500 of the cross-section shown in FIG. 5D. FIG. 5F shows a cross-sectional perspective view of the chip-package 500 taken along the line labelled B-B' in FIG. 5B, and FIG. 5G shows a corresponding side view of the chip-package 500 along the cross-sectioned plane illustrated in FIG. 5F.

According to the embodiment illustrated in FIGS. 5A through 5G, the chip-package 400 includes a carrier 402, such as a PCB, having a first side 404 and a second side 406 opposing the first side 404. A first chip 408 is coupled to the first side 404 of the carrier 402 by a coupling structure 410. The coupling structure 410 may include Cu pillars, filled vias, solder, etc. The coupling structure 410 provides a distance (d1) between the first chip 408 and the carrier 402. A second chip 412 is coupled to the second side 406 of the carrier 402 by a coupling structure 414 which may include Cu pillars, filled vias, solder, etc. and provides a distance (d2) between the second chip 412 and the carrier 402. The chips 408, 412 may be vertically aligned, reducing the parasitic inductance and resistance of the package 400 and yielding a leadless package on both sides with surface I/O and having a small footprint. For example, the distance between the chips 408, 412 can be shortened by 50% and/or the footprint of the package 400 can be reduced by 40%.

The chip-package 400 also includes an encapsulation 416 with a first portion 416a and a second portion 416b. The first portion 416a of the encapsulation 416 at least partially encloses the first chip 408 at the first side 404 of the carrier 402, and the second portion 416b of the encapsulation 416 at least partially encloses the second chip 412 at the second side 406 of the carrier 402. One or more vias 418 extend through the first portion 416a of the encapsulation 416, the carrier 402 and the second portion 416b of the encapsulation 416. An electrically conductive material 420 at least partly covers a sidewall of some or all of the vias 420 in the first portion 416a or the second portion 416b of the encapsulation 416, to electrically contact metal contact areas 403 of the carrier 402 at either the first side 404 or the second side 406.

In one embodiment, the electrically conductive material 420 is formed by plating the upper half or the lower half of the vias 418. The other half of the vias 418 may be devoid of the electrically conductive material 420. For example, the upper or lower half of the vias 418 may be pre-coated so that a plating solution does not adhere/plate this part of the vias 418. A mold compound is mixed with metal powder and insulation material to enable plating of the other half of the vias 418. A laser may be used to remove/burn-off the insulation material that insulates the metal powder to expose the metal, allowing the plating material to plate the metal. The coating remaining on the other part of the sidewall ensures the plating solution effectively passes through the vias 418.

In another embodiment, both the upper half and the lower half of the vias 418 are plated by the electrically conductive material 420. The upper or lower plated half of one or more of the vias 418 electrically contacts metal contact areas 403 of the carrier 402 at one of the sides 404, 406 of the carrier 402, and the other plated half provides a thermal conduction path to the other side 406, 404 of the carrier 402. FIGS. 5D through 5G show only the upper half of the vias 418 plated by the electrically conductive material 420, however, the lower half may instead be plated, or both halves may be coated, e.g., omitting the pre-coating step described above.

Regardless of whether only one half or both halves of the vias 418 are plated with the electrically conductive material 420, a targeted laser may be used to form relatively small vias 418. The ratio of the depth/height (H) of the vias 418 to the width (W) of the vias 418 may be greater than 1:1, e.g., greater than 10:1. For example, the via height (H) may be 1 mm and the width (W) may be 0.1 mm. Other vias 422 may be formed which extend to the carrier 402 through either the first portion 416a or the second portion 416b of the encapsulation, but not through both portions 416a, 416b. These vias 422 may be coated with the same or different electrically conductive material 420, and may electrically contact metal contact areas 403 of the carrier 402 at one side 404/406.

A metallization layer 424 may be located on the first portion 416a or the second portion 416b of the encapsulation 416. Each metallization layer 424 may include metal pads 426 and respective metal traces 428. The metal pads 426 provide I/O interconnection points for the package 400. The metal traces 428 connect the corresponding metal pads 426 to the electrically conductive material 420 at a first end of a via 418/422, and the electrically conductive material 420 electrically contacts a metal contact area 403 of the carrier 402 at a second end of the via 418/422 opposite the first end.

The chip-package 400 may further include a cavity 430 between the first chip 408 and the carrier 402, or between the second chip 412 and the carrier 402. In one embodiment, the chip-package 400 is a QFP (quad flat package) which forms an RF module, the first chip 408 is a MEMS-based tunable filter and the second chip 412 is an RF chip. According to this embodiment, the cavity 430 is provided between the MEMS-based tunable filter and the carrier 402. The cavity 430 may be sealed by a material 432 disposed in the cavity 430 and which surrounds the periphery of the first chip 408.

FIGS. 6A and 6B illustrate an embodiment of sealing a cavity of a chip-package. FIGS. 6A and 6B each show a top-down plan view and corresponding cross-sectional view during different stages of the cavity sealing method. According to the embodiment illustrated in FIGS. 6A and 6B, the cavity is sealed prior to application of the chip-package encapsulation. FIG. 6A shows a first chip 500 coupled to the first side 502 of a carrier 504 by a coupling structure 506. In one embodiment, the first chip 500 is a SAW filter chip and the resulting package forms an RF module. The SAW filter chip 500 may have a flip-chip configuration and a cavity 508 between the first chip 500 and the carrier 504 is sealed by a 2-part gluing process.

FIG. 6A shows the first part of the gluing process, in which a ring of glue 510 is dispensed on the carrier 504 around the perimeter of the first chip 500. In one embodiment, the ring of glue 510 has a thixotropy in a range between 3.5 and 4.0.

FIG. 6B shows the second part of the gluing process, in which a glob of glue 512 is dispensed on the first chip 500 within the perimeter defined by the ring of glue 510. Such a process is commonly referred to as glob-top. In one embodiment, the glob of glue 512 has a thixotropy in a range between 3.5 and 4.0. For example, the ring of glue 510 may have a thixotropy of about 3.5 and the glob of glue 512 may have a thixotropy of about 4.0. The ring of glue 510 together with the glob of glue 512 form a glue-based sealing structure which seals the air cavity 508, preventing mold compound from seeping under the first chip 500 during a subsequent mold process such as film-assisted molding, transfer molding, injection molding, etc. In one embodiment, the glues 510, 512 used to seal the cavity 508 each comprise a silicone material such as silicone die attach material KJR 9602 series sold by Shin-Etsu MicroSi. The resulting glue-on-glue cavity sealing structure allows for reduced package size, and the use of epoxy-based glues provides better adhesion as compared to Si and metal lids. The carrier 504 may have various metal pads 514 and conductive vias 516, to facilitate electrical connections to the package and first chip 500.

Figure 6C:
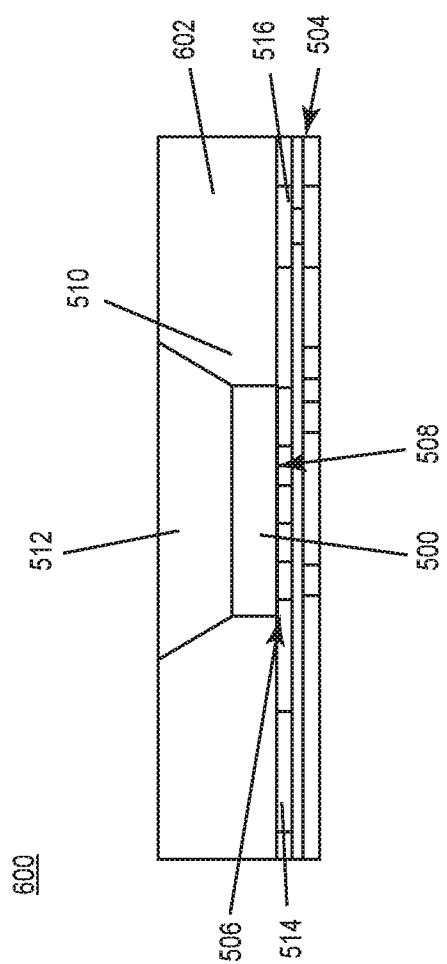
FIG. 6C illustrates an image of an actual exemplary package having a cavity sealed formed by the method shown in FIGS. 6A and 6B.

FIG. 6C shows an image of an actual exemplary package 600 having a cavity sealed 508 formed by the method shown in FIGS. 6A and 6B. The glues 510, 512 together form a glue-based sealing structure which seals the air cavity 508, preventing mold compound 602 from seeping under the first chip 500 during a subsequent mold process such as film-assisted molding, transfer molding, injection molding, etc. The glue-based sealing structure formed by the glues 510, 512 laterally surrounds the first chip 500 and, together with the chip 500 and the carrier 504, defines the cavity 508 between the carrier 504 and the chip 500.

Figures 7A, 7B:
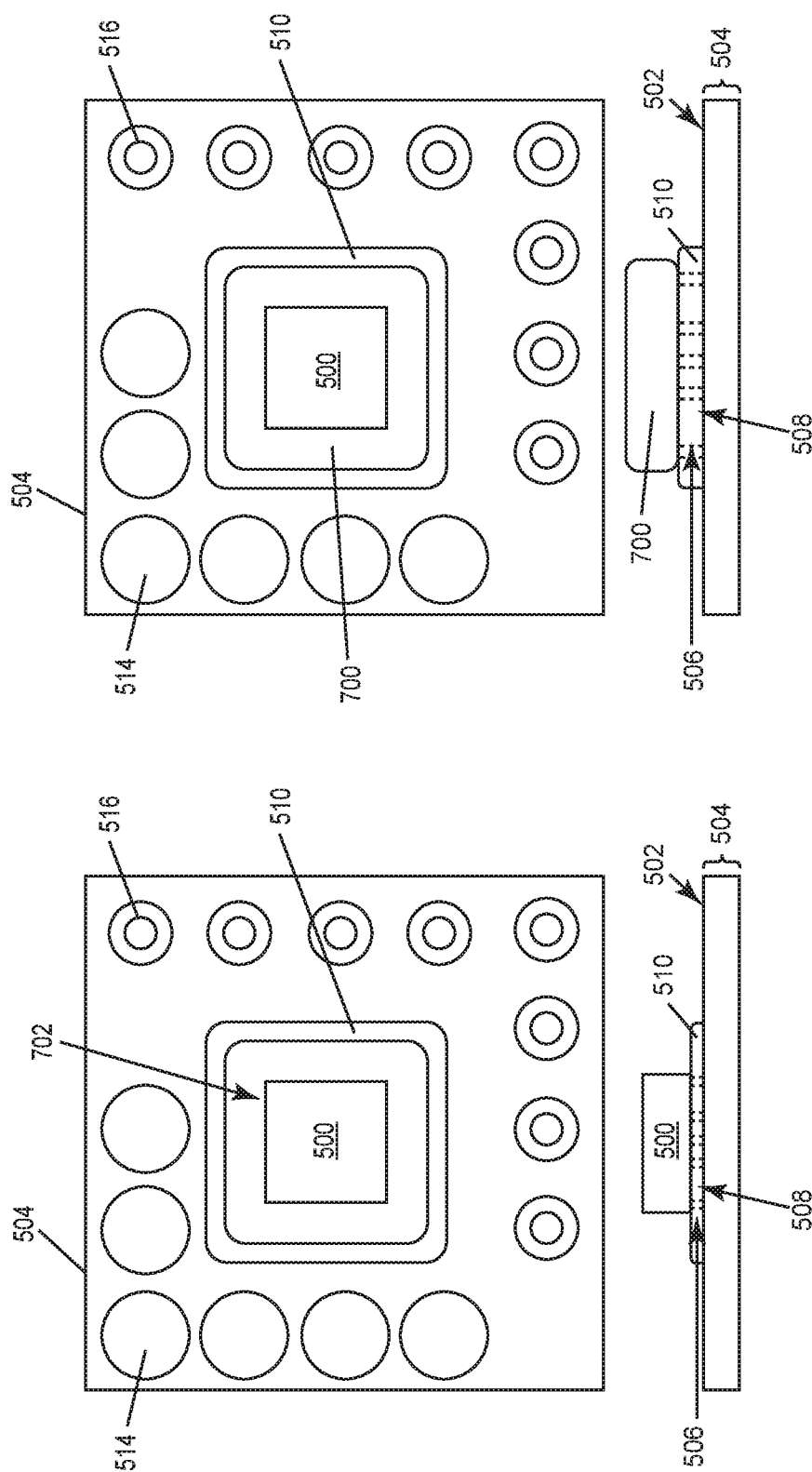
FIGS. 7A and 7B illustrate another embodiment of sealing a cavity of a chip-package.

FIGS. 7A and 7B illustrate another embodiment of sealing a cavity of a chip-package. FIGS. 7A and 7B each show a top-down plan view and corresponding cross-sectional view during different stages of the cavity sealing method. The embodiment shown in FIGS. 7A and 7B is similar to the embodiment illustrated in FIGS. 6A and 6B. Different, however, a glue writing/printing process is used instead of a glob-top process. Similar to FIG. 6A, FIG. 7A shows a ring of glue 510 dispensed on the carrier 504 around the perimeter of the first chip 500. FIG. 7B shows the second part of the gluing process, in which a second ring of glue 700 is dispensed into the gap 702 between the first chip 500 and the first ring of glue 510. Different than the embodiment shown in FIG. 6B, the second ring of glue 700 is dispensed by a standard writing/printing process instead of a glob top process. For example, the second ring of glue 700 may be printed by either screen or stencil.

The glue-based cavity sealing structures described herein may be subject to pressure that build-ups during the glue curing process. If unmitigated, the pressure may cause the glue-based sealing structure to bulge and possibly rupture, providing a path for encapsulation material to subsequently enter. The cavity may be partly or completely filled with the encapsulation material if the glue-based cavity sealing structure ruptures, rendering the chip adjacent the filled cavity ineffective for its intended use. For example, a MEMS-based pressure sensor or SAW filter would function poorly if at all if a mold compound entered the cavity and solidified against the sensitive area of the chip.

Figure 8:
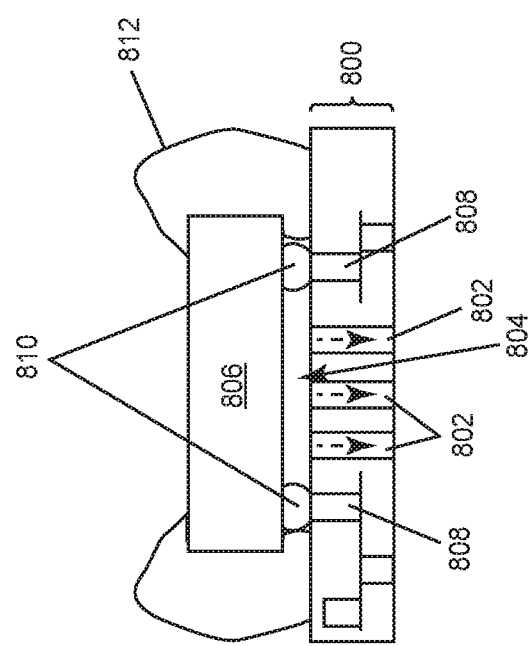
FIG. 8 illustrates a cross-sectional view of an embodiment of a chip-package carrier having one or more vent holes.

FIG. 8 illustrates a cross-sectional view of an embodiment of a carrier 800 which has one or more vent holes 802 for providing a passage to a cavity 804 formed between the carrier 800 and a chip 806 coupled to electrically conductive regions 808 of the carrier 800 by a coupling structure 810. A glue-based cavity sealing structure 812, e.g. of the kind previously described herein in connection with FIG. 6A-6B or 7A-7B, seals the cavity 804 between the carrier 800 and the chip 806. The vent hole(s) 802 remain unplugged during the glue curing process, so that pressure which builds-up in the cavity 804 during glue curing can escape through the vent hole(s) 802. The escaping gas is illustrated as downward dashed arrows in FIG. 8.

The passage formed by the vent hole(s) 802 may be sealed at the exit side after completion of the glue curing, e.g., to prevent encapsulation material from subsequently entering the cavity 804 through the vent hole(s) 802. For example, a material (not shown) may at least partly fill the vent hole(s) 802 to close off the passage. The material at least partly filling the vent hole(s) 802 may comprises solder, a Cu pillar, a SnAg bump, glue and/or epoxy, etc. The passage formed by the vent hole(s) 802 may be designed to be resistant towards the air path sealing material, for example, with a partially or fully coated finish, and not limited to a copper finish with solder deposition to cover, gold finish for chip sealing, glue material, etc.

Figure 9C:
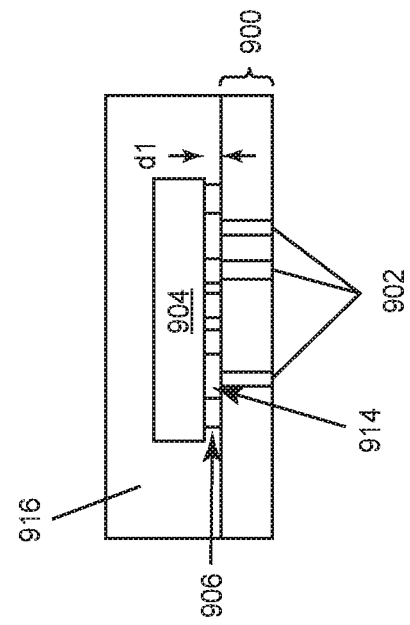
FIGS. 9A through 9C illustrate an embodiment of forming vent holes in a chip-package carrier.
Figure 9B:
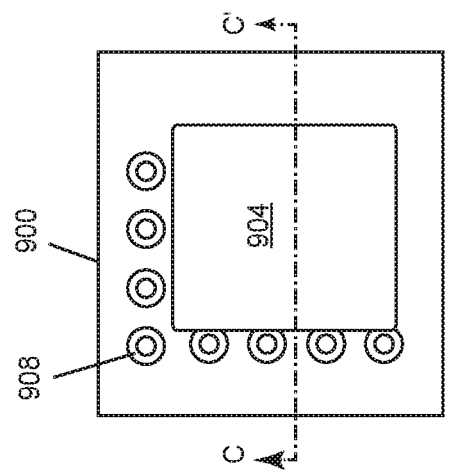
Figure 9A:
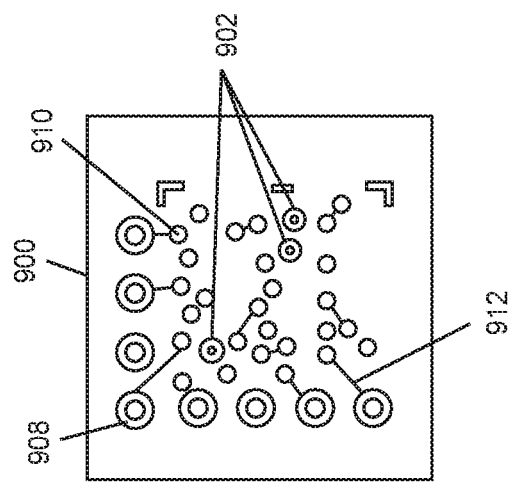

FIGS. 9A through 9C illustrate an embodiment of forming vent holes in a carrier. FIG. 9A shows a top plan view of the carrier 900 after vent holes 902 are formed in the carrier 900, and before a chip 904 is coupled to the carrier 900 by a coupling structure 906. The carrier 900 may include plated through-holes 908 for providing electrical connections between both sides of the carrier 900. The carrier 900 may also include metal pads 910 connected by metal traces 912 to the plated through-holes 908. The carrier 900 further includes vent holes 902. The vent holes 902 may be formed in the same way as the through-holes 908, e.g., by laser drilling, mechanical drilling using a drill bit, etc. The vent holes 902 may or may not be plated. FIG. 9B shows the carrier 900 after the chip 904 is coupled to the carrier 900 by the coupling structure 906. The coupling structure 906 may include Cu pillars, filled vias, solder, etc. and provides a distance (d1) between the first chip 904 and the carrier 900, as previously described herein. The coupling structure 906 is connected to the metal pads 910 of the carrier 900. FIG. 9C is a cross-sectional view along the line labelled C-C' in FIG. 9B. As shown in FIG. 9C, the vent holes 902 remain unplugged until after the cavity 914 between the carrier 900 and the chip 904 is sealed, e.g., using a glue-based cavity sealing structure 916 of the kind previously described herein in connection with FIG. 6A-6B or 7A-7B. The glue-based sealing structure 916 at least laterally surrounds the chip 904, and together with the chip 904 and the carrier 900, defines the cavity 914 between the carrier 900 and the chip 904. Pressure which builds-up in the cavity 914 during the glue curing process escapes through the vent holes 902. The vent holes 902 may be filled/sealed after completion of the glue curing, e.g., as previously described herein.

Figure 10A:
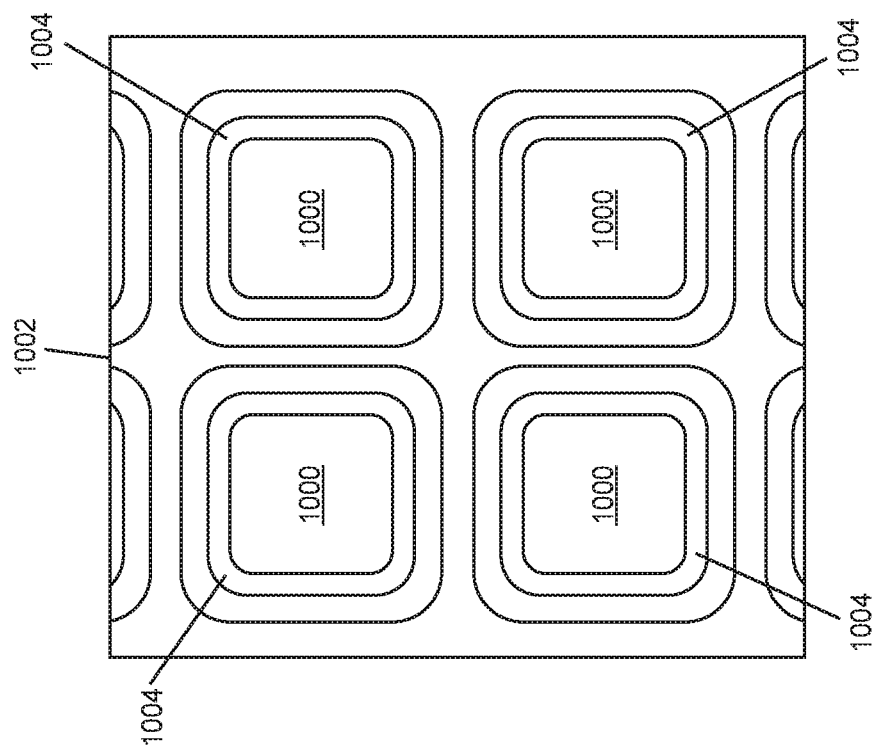
FIG. 10A illustrates a top-down plan view of a PCB-based carrier without vent holes in the chip-package carriers.

FIG. 10A illustrates a top-down plan view of a plurality of chips 1000 coupled to a PCB-based carrier 1002. A glue-based sealing structure 1004 is provided for each chip 1000, to seal the cavity between the carrier 1002 and the respective chips 1000. The carrier 1002 shown in FIG. 10A does not include vent holes for releasing pressure during the glue curing process. Bulges 1006 in the glue-based sealing structures 1004 are plainly evident in FIG. 10A. The glue curing process was performed at 150 C for 2 hours in this example, and the bulging began to occur at 35 C and continued even after the curing conditions were removed.

Figure 10B:
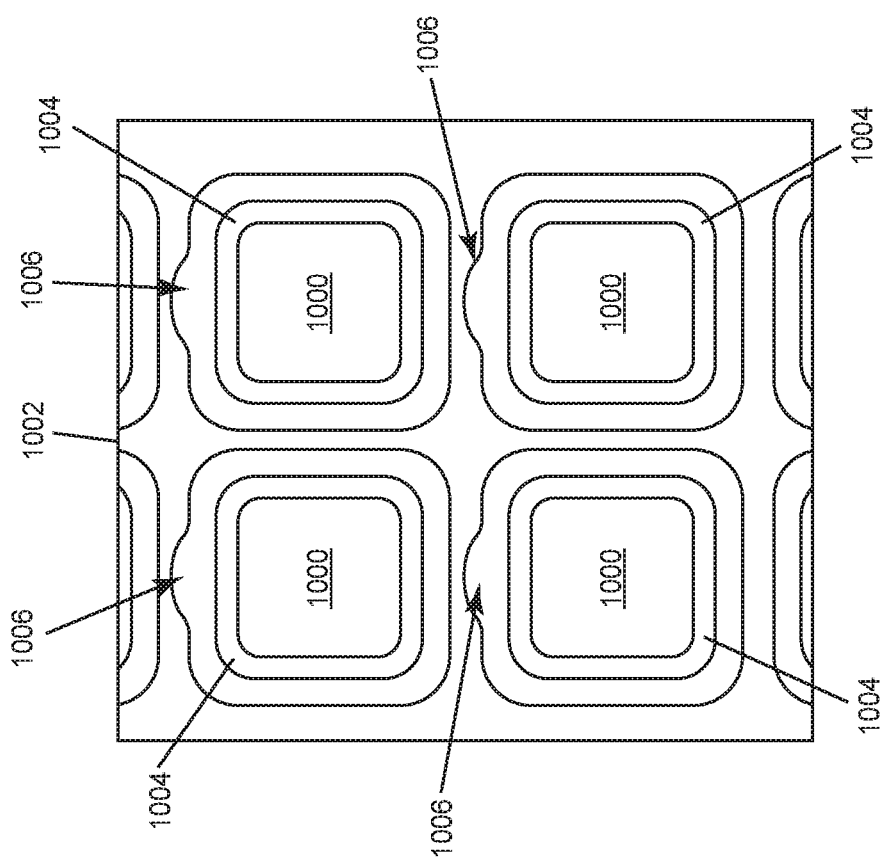
FIG. 10B illustrates a top-down plan view of the same PCB-based carrier with vent holes in the carriers.

FIG. 10B illustrates a top-down plan view of the same PCB-based carrier 1002 as shown in FIG. 10A, but vent holes which are out of view in FIG. 10B below the chips 1000 are formed in the carrier 1002 as previously described herein. The vent holes provide a passage to the respective cavities under the chips 1000, allowing pressure which builds-up during the glue curing process to escape. The glue-based sealing structures 1004 in FIG. 10B did experience bulging during the same curing conditions as in FIG. 10A. The vent holes may be filled/sealed after the glue curing process, as previously described herein.

Figure 11A:
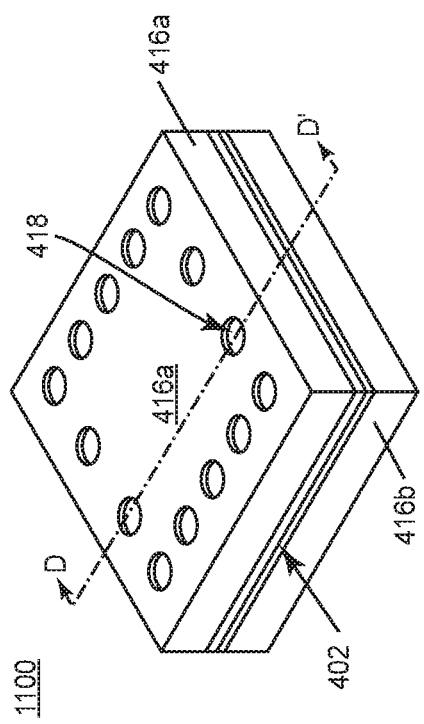
FIGS. 11A through 11D illustrate different views of another embodiment of a chip-package having an arrangement of stacked chips.
Figure 11B:
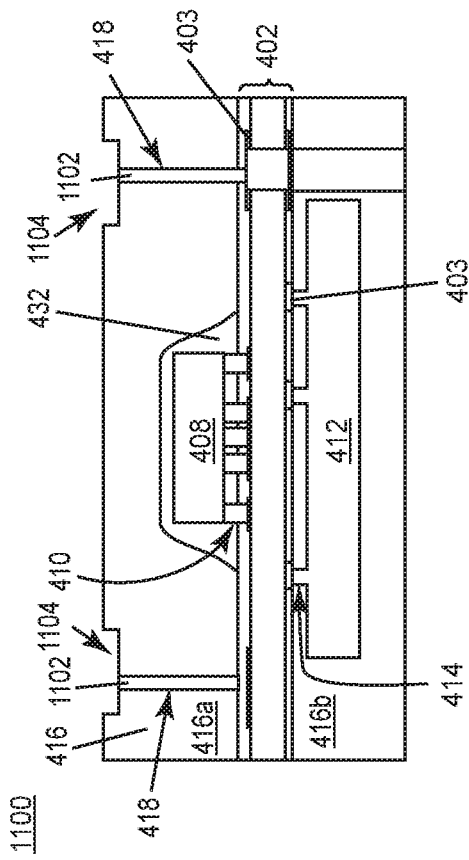
Figure 11C:
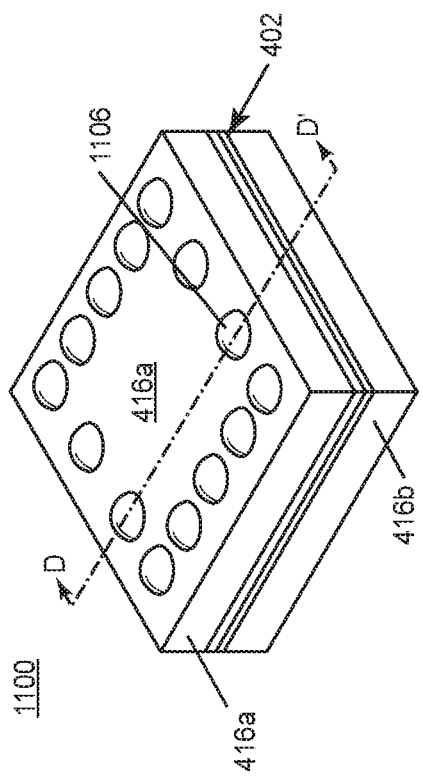
Figure 11D:
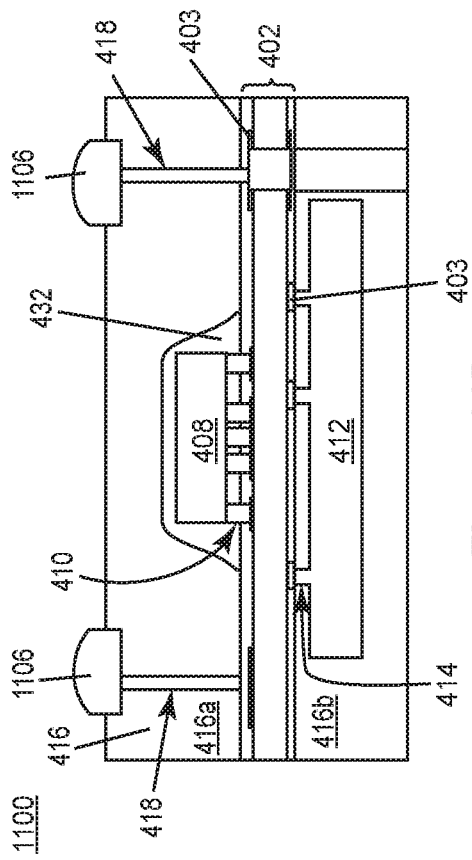

FIGS. 11A through 11D illustrate another embodiment of a chip-package 1100 having an arrangement of stacked chips 408, 412. The embodiment shown in FIGS. 11A through 11D is similar to the embodiment illustrated in FIGS. 5A through 5G. Different, however, the electrically conductive material 420 fills the vias 418 in the periphery of the upper portion 116a of the encapsulation 116 to form wire-like conductors 1102. A notch or recess 1104 may be formed in the outer side of the encapsulation material 416 at which the wire-like conductors 1102 terminate. A solder bump 1106 may be formed in each notch/recess 1104 for electrically contacting the wire-like conductors 1102 at a first end of the vias 418. The wire-like conductors 1102 contact the carrier 402 at a second end of the vias 418 opposite the first end. FIG. 11A shows the chip-package 1100 after the notches/recesses 1104 are formed in the encapsulation 416, but before via plating and before solder bump formation. FIG. 11B shows a corresponding cross-sectional view along the line labeled D-D' in FIG. 11A, but after via plating. FIG. 11O shows the chip-package 1100 after the solder bumps 1106 are formed in the notches/recesses 1104 in the encapsulation 416, and FIG. 11D shows a corresponding cross-sectional view along the line labeled D-D' in FIG. 11O.

Figure 12:
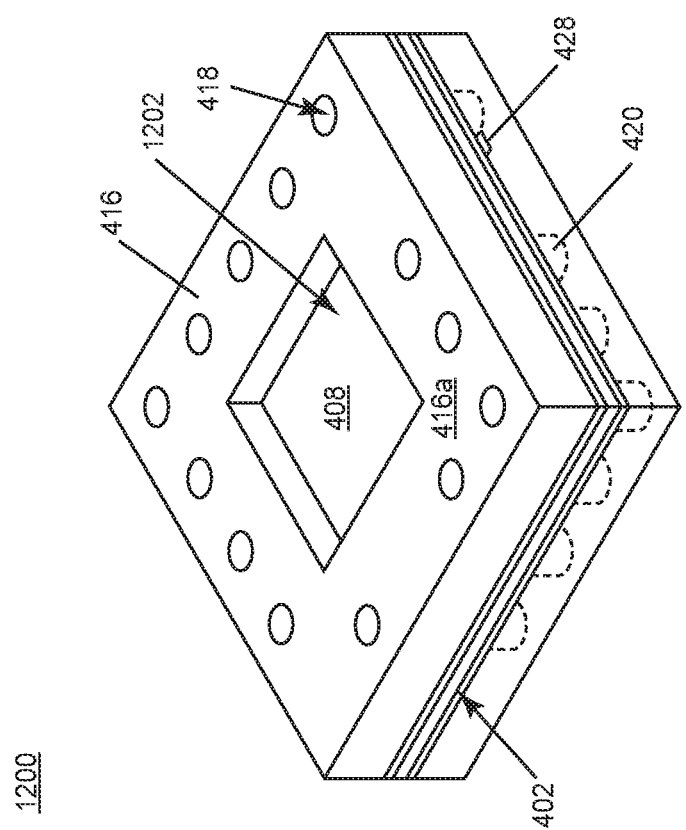
FIG. 12 illustrates a side perspective view of another embodiment of a chip-package having an arrangement of stacked chips.

FIG. 12 illustrates a side perspective view of another embodiment of a chip-package 1200 having an arrangement of stacked chips. The embodiment shown in FIG. 12 is similar to the embodiment illustrated in FIGS. 11A through 11D. Different, however, the chip 408 adjacent the sealed cavity has an exposed surface 1202, which can be readily realized during the encapsulation process. FIG. 12 shows certain internal details of the package 1200 in view in the lower part of the package 1200.

Various chip-package embodiments have been illustrated and described. The following examples are also provided.

Example 1: a chip-package comprises a carrier having a first side and a second side opposing the first side, a first chip coupled to the first side of the carrier, a second chip coupled to the second side of the carrier, an encapsulation with a first portion, which at least partially encloses the first chip on the first side of the carrier, and a second portion, which at least partially encloses the second chip on the second side of the carrier, at least one via, wherein the via extends through the first portion of the encapsulation, the carrier and the second portion of the encapsulation, and an electrically conductive material at least partially filling the at least one via to electrically contact the carrier. A corresponding method of forming a chip-package comprises: providing a carrier with a first side and a second side opposing the first side; coupling a first chip to the first side of the carrier; coupling a second chip to the second side of the carrier; at least partially encapsulating the first chip on the first side of the carrier with a first portion of an encapsulation and at least partially encapsulating the second chip on the second side of the carrier with a second portion of the encapsulation; forming at least one via, wherein the via extends through the first portion of the encapsulation, the carrier and the second portion of the encapsulation; and at least partially filling an electrically conductive material into the at least one via to electrically contact the carrier.

Example 2: the chip-package/method of example 1 wherein the carrier comprises at least one metallization layer and the first chip and the second chip are electrically coupled to the metallization layer.

Example 3: the chip-package/method of examples 1 or 2, wherein the carrier comprises at least a first metallization layer and a second metallization layer, wherein the first chip is electrically coupled to the first metallization layer and the second chip is electrically coupled to the second metallization layer, wherein optionally the carrier comprises vias electrically coupling at least parts of the first metallization layer to at least parts of the second metallization layer.

Example 4: the chip-package/method of example 3, wherein the first metallization layer is located on the first side of the carrier and the second metallization layer is located on the second side of the carrier.

Example 5: the chip-package/method of any one of examples 1 to 4, wherein the carrier comprises at least one electrically non-conductive layer.

Example 6: the chip-package/method of any one of examples 1 to 5, wherein the carrier is a printed-circuit board.

Example 7: the chip-package/method of any one of examples 1 to 6, wherein the first chip is one or a combination of two or more of the following group, the group consisting of a controller chip, a logic chip, a MEMS chip, a sensor chip, a power chip, a chip comprising a circuit with a tunable filter, a chip comprising a circuit with a SAW filter and/or a BAW filter, and wherein the second chip is one or a combination of two or more of the following group, the group containing a controller chip, a logic chip, a MEMS chip, a sensor chip, a power chip, a chip comprising a circuit with a tunable filter, a chip comprising a circuit with a SAW filter and/or a BAW filter.

Example 8: the chip-package/method of any one of examples 1 to 7, wherein the first chip has a different configuration than the second chip.

Example 9: the chip-package/method of any one of examples 1 to 8, wherein the first chip is electrically coupled to the second chip.

Example 10: the chip-package/method of any one of examples 1 to 9, wherein at least one of the first chip or the second chip are electrically coupled to the carrier by a coupling structure, wherein optionally the coupling structure provides a distance between the first chip and the carrier and/or between the second chip and the carrier.

Example 11: the chip-package/method of example 10, wherein the chip-package comprises a cavity between the first chip and at least one of the carrier or the chip-package comprises a cavity between the second chip and the carrier.

Example 12: the chip-package/method of example 11, wherein the cavity comprises an air cavity.

Example 13: the chip-package/method of examples 10 to 12, wherein the coupling structure coupling the first chip to the carrier comprises solder balls.

Example 14: the chip-package/method of any one of examples 1 to 13, wherein the coupling structure coupling the second chip to the carrier comprises solder balls.

Example 15: the chip-package/method of any one of examples 1 to 14, wherein the first portion of the encapsulation and the second portion of the encapsulation are in physical contact and optionally enclose the carrier.

Example 16: the chip-package/method of any one of examples 1 to 15, wherein the first portion of the encapsulation is separated from the second portion of the encapsulation.

Example 17: the chip-package/method of any one of examples 1 to 16, wherein the first portion of the of the encapsulation, the carrier and the first chip define a cavity between the first chip and the carrier.

Example 18: the chip-package/method of any one of examples 1 to 17, wherein the second portion of the of the encapsulation, the carrier and the second chip define a cavity between the second chip and the carrier.

Example 19: the chip-package/method of any one of examples 1 to 18, wherein at least one of the first portion of the encapsulation or the second portion of the encapsulation comprises a mold.

Example 20: the chip-package/method of example 19, wherein the material of the first portion of the encapsulation differs from the material of the second portion of the encapsulation.

Example 21: the chip-package/method of any one of examples 1 to 20, wherein the first chip comprises a first side which is coupled to a coupling structure to electrically couple the first chip to the carrier and the first chip comprises a second side opposing the first side, wherein the second side of the first chip part is at least partially free from the first portion of the encapsulation.

Example 22: the chip-package/method of any one of examples 1 to 21, wherein the second chip comprises a first side which is coupled to a coupling structure to electrically couple the second chip to the carrier and the second chip comprises a second side opposing the first side, wherein second side of the second chip is at least partially free from the second portion of the encapsulation.

Example 23: the chip-package/method of any one of examples 1 to 22, wherein the carrier comprises one or more metallization layers and the electrically conductive material in the via is electrically coupled to the one or more metallization layers.

Example 24: the chip-package/method of any one of examples 1 to 23, wherein the electrically conductive material in the via is electrically coupled to the first chip and/or the second chip.

Example 25: the chip-package/method of any one of examples 1 to 24, wherein the chip-package comprises a plurality of vias, each of which is partially filled with an electrically conductive material, and wherein at least one further via is electrically coupled to the second chip.

Example 26: the chip-package/method of example 25, wherein the at least one via is free of an electrical coupling to the second chip, and wherein the at least one further via is free of an electrical coupling to the first chip.

Example 27: the chip-package/method of any one of examples 1 to 26, wherein the electrically conductive material in the at least one via extends through the first portion of the encapsulation.

Example 28: the chip-package/method of example 27, wherein a part of the at least one via extending through the second portion of the encapsulation is free of electrically conductive material.

Example 29: the chip-package/method of any one of examples 1 to 28, wherein the electrically conductive material in the at least one via extends through the second portion of the encapsulation.

Example 30: the chip-package/method of example 29, wherein a part of the at least one via extending through the first portion of the encapsulation is free of electrically conductive material.

Example 31: the chip-package/method of any one of examples 1 to 30, wherein the at least one via comprises a cavity extending through the first portion of the encapsulation, the carrier and the second portion of the encapsulation.

Example 32: the chip-package/method of example 31, wherein the electrically conductive material at least partially forms a sidewall of the cavity.

Example 33: the chip-package/method of any one of examples 1 to 32, wherein the chip-package comprises an interface coupled to the at least one via.

Example 34: the chip-package/method of example 33, wherein the interface is configured to introduce at least one of a gas or a liquid through the cavity of the at least one via.

Example 35: the chip-package/method of any one of examples 1 to 34, wherein the structure of the electrically conductive material of the at least one via is defined by plating the electrically conductive material within the at least one via.

Example 36: the chip-package/method of example 35, wherein the plating process comprises an electroless plating process.

Example 37: the chip-package/method of any one of examples 1 to 36, wherein a metallization layer is located on the first portion of the encapsulation.

Example 38: the chip-package/method of any one of examples 1 to 37, wherein a metallization layer is located on the second portion of the encapsulation.

Example 39: the chip-package/method of any one of examples 1 to 38, wherein the electrically conductive material within the at least one via is electrically coupled to at least one of the metallization layer located on the first portion of the encapsulation or the metallization layer located on the second portion of the encapsulation.

Example 40: the chip-package/method of any one of examples 37 to 39, wherein the metallization layer comprises a plurality of metallization layers.

Example 41: the chip-package/method of any one of examples 37 to 40, wherein the metallization layer forms a re-distribution layer.

Example 42: the chip-package/method of any one of examples 37 to 41, wherein the metallization layer comprises at least one contact pad.

Example 43: the chip-package/method of any one of examples 37 to 42, wherein the metallization layer is electrically coupled to the first chip.

Example 44: the chip-package/method of any one of examples 37 to 43, wherein the metallization layer is electrically coupled to the second chip.

Example 45: a chip-package comprises a carrier with a first side, a first chip coupled to the first side of the carrier by a coupling structure, wherein the coupling structure provides a distance between the first chip and the carrier, and an encapsulation on the first side of the carrier, wherein the encapsulation is at least partially laterally spaced apart from the first chip as to form a gap between the first chip and the encapsulation, wherein the gap extends to the first side of the carrier.

Example 46: the chip-package of example 45, wherein the gap comprises an air gap.

Example 47: the chip-package of any one of examples 45 or 46, further comprising a material in the gap between the first chip and the encapsulation, wherein a cavity is formed by the material in the gap, the carrier and the chip.

Example 48: the chip-package of example 47, wherein the geometrical form of the material is defined by the material being a hardened liquid material being filled in the gap as liquid material with a viscosity and a surface tension and a successive hardening to transform the liquid material to a solid material, and wherein the liquid material by its viscosity and its surface tension at least partially fills the gap between the first chip and the encapsulation but at most partly fills the cavity.

Example 49: the chip-package of any one of examples 45 to 48, wherein a surface of the material in the gap between the first chip and the encapsulation closes form-fitting with a surface of the encapsulation and/or closes form-fitting with a surface of the first chip.

Example 50: the chip-package of any one of the example 45 to 49, wherein the material at least partially covers the first chip.

Example 51: the chip-package of example 50, wherein a surface of the material above the chip closes form-fitting with a surface of the encapsulation.

Example 52: the chip-package of any one of examples 45 to 51, wherein the material in the gap between the first chip and the encapsulation is at least one of the following group, the group consisting of a polymer clay, a foam, a PE foam, a gel, polyvinyl chloride.

Example 53: the chip-package of any one of examples 45 to 52, wherein the material in the gap between the first chip and the encapsulation is electrically insulating.

Example 54: the chip-package of any one of examples 45 to 53, further comprising a second chip coupled to the second side of the carrier, a second portion of the encapsulation, which at least partially encloses the second chip on the second side of the carrier, and at least one via, wherein the via extends through the first portion of the encapsulation, the carrier and the second portion of the encapsulation.

Example 55: the chip-package of any one of examples 45 to 54, wherein the carrier comprises at least one metallization layer and the first chip and/or the second chip are electrically coupled to the metallization layer.

Example 56: the chip-package of any one of examples 45 to 55, wherein the carrier comprises at least a first and a second metallization layer, wherein the first chip is electrically coupled to the first metallization layer and/or the second chip is electrically coupled to the second metallization layer.

Example 57: the chip-package of examples 56, wherein the carrier comprises vias electrically coupling at least parts of the first metallization layer to at least parts of the second metallization layer.

Example 58: the chip-package of any one of examples 56 or 57, wherein the first metallization layer is located on the first side of the carrier and the second metallization layer is located on the second side of the carrier.

Example 59: the chip-package of any one of examples 45 to 58, wherein the carrier comprises at least one electrically non-conductive layer Example 60: the chip-package of any one of examples 45 to 59, wherein the carrier is a printed-circuit board.

Example 61: the chip-package of any one of examples 45 to 60, wherein the first chip is one or a combination of two or more of the following group, the group consisting of a controller chip, a logic chip, a MEMS chip, a sensor chip, a power chip, a chip comprising a circuit with a tunable filter, a chip comprising a circuit with a SAW filter and/or a BAW filter.

Example 62: the chip-package of any one of examples 54 to 61, wherein the second chip is one or a combination of two or more of the following group, the group containing a controller chip, a logic chip, a MEMS chip, a sensor chip, a power chip, a chip comprising a circuit with a tunable filter, a chip comprising a circuit with a SAW filter and/or a BAW filter.

Example 63: a method of cooling a chip-package, wherein the chip-package is a chip-package according to any one of the previous examples, wherein a gas and/or a liquid is introduced into the cavity in the at least one via.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A chip-package, comprising:
    a carrier having a first side and a second side opposing the first side;
    a first chip coupled to the first side of the carrier;
    a second chip coupled to the second side of the carrier;
    an encapsulation with a first portion, which at least partially encloses the first chip on the first side of the carrier, and a second portion, which at least partially encloses the second chip on the second side of the carrier;
    a via extending through the first portion of the encapsulation, the carrier and the second portion of the encapsulation;
    an electrically conductive material at least partly covering a sidewall of the via in the first portion or the second portion of the encapsulation, to electrically contact the carrier at either the first side or the second side; and
    a cavity between the first chip and the carrier, or between the second chip and the carrier.

2. The chip-package of claim 1, wherein an upper half or a lower half of the via is plated by the electrically conductive material, and wherein the other half of the via is devoid of the electrically conductive material.

3. The chip-package of claim 1, wherein an upper half and a lower half of the via are each plated by the electrically conductive material, wherein one of the plated halves of the via electrically contacts the carrier at one of the sides of the carrier, and wherein the other plated half of the via provides a thermal conduction path to the other side of the carrier.

4. The chip-package of claim 1, wherein the first chip and the second chip are vertically aligned.

5. The chip-package of claim 1, further comprising a metallization layer located on the first portion or the second portion of the encapsulation, wherein the metallization layer comprises a metal pad and a metal trace which connects the metal pad to the electrically conductive material at a first end of the via, and wherein the electrically conductive material electrically contacts the carrier at a second end of the via opposite the first end.

6. The chip-package of claim 1, wherein a ratio of a depth of the via to a width of the via is greater than 1:1.

7. The chip-package of claim 1, wherein the electrically conductive material fills the via in the first portion or the second portion of the encapsulation.

8. The chip-package of claim 7, further comprising a solder bump electrically contacting the electrically conductive material at a first end of the via, wherein the electrically conductive material electrically contacts the carrier at a second end of the via opposite the first end.

9. The chip-package of claim 1, further comprising a material sealing the cavity around a perimeter of a recess formed in the encapsulation and in which the first chip or the second chip is disposed.

10. The chip-package of claim 9, wherein the material is a polymer clay, an insulative rigid foam or a gel.

11. The chip-package of claim 1, wherein the first chip or the second chip is a MEMS chip, and wherein the cavity abuts the MEMS chip.

12. The chip-package of claim 1, further comprising:
    a glue-based sealing structure sealing the cavity.

13. The chip-package of claim 12, wherein the glue-based sealing structure comprises a first glue laterally surrounding the first chip or the second chip and a second glue covering the chip laterally surrounded by the first glue.

14. The chip-package of claim 12, wherein the glue-based sealing structure comprises a first glue laterally surrounding the first chip or the second chip and a second glue filling a gap between the first glue and the chip laterally surrounded by the first glue.

15. The chip-package of claim 1, further comprising:
    one or more vent holes formed in the carrier and providing a passage to the cavity.

16. The chip-package of claim 15, further comprising a material at least partly filling the one or more vent holes to close off the passage.

17. The chip-package of claim 16, wherein the material at least partly filling the one or more vent holes comprises solder, a Cu pillar, a SnAg bump, glue and/or epoxy.

18. A chip-package, comprising:
    a carrier having a first side and a second side opposing the first side;
    a first chip coupled to the first side of the carrier;
    an encapsulation which at least partially encloses the first chip on the first side of the carrier;
    a cavity between the first chip and the carrier;
    a glue-based sealing structure laterally surrounding the first chip and partly defining the cavity; and
    one or more vent holes formed in the carrier and providing a passage to the cavity.

19. The chip-package of claim 18, further comprising a material at least partly filling the one or more vent holes to close off the passage.

20. The chip-package of claim 19, wherein the material at least partly filling the one or more vent holes comprises solder, a Cu pillar, a SnAg bump, glue and/or epoxy.

21. A chip-package, comprising:
    a carrier having a first side and a second side opposing the first side;
    a first chip coupled to the first side of the carrier;
    a second chip coupled to the second side of the carrier;
    an encapsulation with a first portion, which at least partially encloses the first chip on the first side of the carrier, and a second portion, which at least partially encloses the second chip on the second side of the carrier;
    a via extending through the first portion of the encapsulation, the carrier and the second portion of the encapsulation; and
    an electrically conductive material at least partly covering a sidewall of the via in the first portion or the second portion of the encapsulation, to electrically contact the carrier at either the first side or the second side,
    wherein an upper half or a lower half of the via is plated by the electrically conductive material, and the other half of the via is devoid of the electrically conductive material.

22. A chip-package, comprising:
    a carrier having a first side and a second side opposing the first side;
    a first chip coupled to the first side of the carrier;
    a second chip coupled to the second side of the carrier;
    an encapsulation with a first portion, which at least partially encloses the first chip on the first side of the carrier, and a second portion, which at least partially encloses the second chip on the second side of the carrier;

a via extending through the first portion of the encapsulation, the carrier and the second portion of the encapsulation;

an electrically conductive material at least partly covering a sidewall of the via in the first portion or the second portion of the encapsulation, to electrically contact the carrier at either the first side or the second side; and a metallization layer located on the first portion or the second portion of the encapsulation, wherein the metallization layer comprises a metal pad and a metal trace which connects the metal pad to the electrically conductive material at a first end of the via, wherein the electrically conductive material electrically contacts the carrier at a second end of the via opposite the first end.

* * * * *